(12) United States Patent
Linares

(10) Patent No.: US 8,158,455 B2
(45) Date of Patent: Apr. 17, 2012

(54) BORON-DOPED DIAMOND SEMICONDUCTOR

(75) Inventor: Robert C. Linares, Sherborn, MA (US)

(73) Assignee: Apollo Diamond, Inc., Framingham, MA (US)

( * ) Notice: Subject to any disclaimer, the term of this patent is extended or adjusted under 35 U.S.C. 154(b) by 0 days.

(21) Appl. No.: 12/546,096

(22) Filed: Aug. 24, 2009

(65) Prior Publication Data

US 2009/0311852 A1 Dec. 17, 2009

Related U.S. Application Data

(62) Division of application No. 11/043,684, filed on Jan. 26, 2005, now abandoned.

(51) Int. Cl.
*H01L 21/20* (2006.01)

(52) U.S. Cl. .......... 438/105; 438/478; 438/570; 257/77; 257/E21.095; 257/E21.096; 257/E21.041; 257/E21.049; 257/E21.323

(58) Field of Classification Search ............ 257/77, 257/E21.09, E21.41, E21.049, E21.323, E21.095, 257/E21.096, E21.041; 438/478, 570, 105
See application file for complete search history.

(56) References Cited

U.S. PATENT DOCUMENTS

| | | | |
|---|---|---|---|
| 3,895,313 A | 7/1975 | Seitz | |
| 5,245,189 A * | 9/1993 | Satoh et al. | 250/343 |
| 5,252,840 A | 10/1993 | Shiomi et al. | |
| 5,285,084 A * | 2/1994 | von Windheim et al. | 257/77 |
| 5,309,000 A | 5/1994 | Saito et al. | |
| 5,360,479 A | 11/1994 | Banholzer et al. | |
| 5,541,423 A | 7/1996 | Hirabayashi | |
| 5,877,070 A * | 3/1999 | Goesele et al. | 438/458 |
| 6,534,380 B1 * | 3/2003 | Yamauchi et al. | 438/455 |
| 6,582,513 B1 * | 6/2003 | Linares et al. | 117/93 |
| 6,589,333 B1 * | 7/2003 | Gosele et al. | 117/84 |
| 2001/0001385 A1 * | 5/2001 | Nakamura et al. | 117/84 |
| 2003/0075100 A1 | 4/2003 | Butler et al. | |
| 2006/0163584 A1 | 7/2006 | Linares | |

FOREIGN PATENT DOCUMENTS

| | | |
|---|---|---|
| WO | WO-03062507 | 7/2003 |
| WO | WO-2006081304 A2 | 8/2006 |
| WO | WO-2006081304 A3 | 8/2006 |

OTHER PUBLICATIONS

"Chinese Application Serial No. 200680009050.X, Office Action mailed Mar. 18, 2010", 8 pgs.

"Chinese Application Serial No. 200680009050.X, Response filed Mar. 10, 2009 to Office Action mailed Oct. 31, 2008", (w/ English Translation of Amended Claims), 20 pgs.

"U.S. Appl. No. 11/043,684, Response filed Oct. 14, 2008 to Non-Final Office Action mailed May 14, 2008", 11 pgs.

(Continued)

*Primary Examiner* — Tom Thomas
*Assistant Examiner* — Benjamin Tzu-Hung Liu
(74) *Attorney, Agent, or Firm* — Schwegman, Lundberg & Woessner, P.A.

(57) ABSTRACT

First and second synthetic diamond regions are doped with boron. The second synthetic diamond region is doped with boron to a greater degree than the first synthetic diamond region, and in physical contact with the first synthetic diamond region. In a further example embodiment, the first and second synthetic diamond regions form a diamond semiconductor, such as a Schottky diode when attached to at least one metallic lead.

12 Claims, 3 Drawing Sheets

OTHER PUBLICATIONS

"U.S. Appl. No. 11/043,684, Final Office Action mailed Dec. 24, 2008", 19 pgs.

"U.S. Appl. No. 11/043,684, Non Final Office Action mailed Oct. 12, 2006", 13 pgs.

"U.S. Appl. No. 11/043,684, Non-Final Office Action mailed Jul. 17, 2007in U.S. Appl. No. 11/043,684", 13 pgs.

"U.S. Appl. No. 11/043,684, Response filed Jan. 17, 2008 to Non-Final Office Action mailed Jul. 17, 2007", 11 pgs.

"U.S. Appl. No. 11/043,684, Response filed Apr. 12, 2007 to Non Final Office Action mailed Oct. 12, 2006", 13 pgs.

"U.S. Appl. No. 11/043,684, Response filed Jul. 28, 2006 to Restriction Requirement mailed Feb. 28, 2006", 10 pgs.

"U.S. Appl. No. 11/043,684, Restriction Requirement mailed Feb. 28, 2006", 4 pgs.

"Chinese Application No. 200680009050.X , Office Action Mailed Nov. 25, 2008", 11 pgs.

"International Search Report and Written Opinion for Application No. PCT/US2006/002669, date mailed Sep. 26, 2006", 14 Pages.

"U.S. Appl. No. 11/043,684, Non-Final Office Action mailed May 14, 2008", 17 pgs.

Anthony, T. R, et al., "Thermal Diffusivity of Isotopically enriched 12C diamond", *Physical Review B*, 42(2), (Jul. 15, 1990), 1104-1111.

Ebert, W., et al., "Epitaxial Diamond Schottky Barriar Diode With On/Off Current Ratios In Excess of 10 Exp (7) at high Temperatures", *Technical Digest of the International Electron Devices Meeting*, (40), (Dec. 11, 1994), 419-422.

* cited by examiner

BORON-DOPED DIAMOND SEMICONDUCTOR

CLAIM OF PRIORITY

This application is a Divisional of U.S. application Ser. No. 11/043,684, filed Jan. 26, 2005 now abandoned, which is incorporated herein by reference in its entirety.

FIELD OF THE INVENTION

The invention relates generally to diamond fabrication, and more specifically to fabricating boron-doped diamond semiconductor devices.

BACKGROUND OF THE INVENTION

A wide variety of semiconductor devices are used as basic electronic building blocks to form electronic devices from computers to cellular telephones, home entertainment systems, and automobile control systems. Other devices use semiconductors for purposes not related to computing or processing power, such as audio amplifiers, industrial control systems, and for other such purposes.

Modern semiconductors are typically based on silicon, with various elements doped to change their electrical properties. For example, doping silicon with phosphorous creates a surplus of electrons resulting in n-type semiconductor material due to the fifth valence electron not present in silicon, which has only four valence electrons. Similarly, doping silicon with boron creates p-type silicon having a surplus of "holes", or an absence of electrons, because boron has only three valence electrons which is one fewer than silicon.

When n-type and p-type silicon are in contact with one another, electricity flows in one direction across the junction more easily than in the other direction. More complex configurations of n-type and p-type material can be assembled to form various types of transistors, integrated circuits, and other such devices.

But, the performance of certain semiconductor devices is limited by the properties inherent in the semiconductor materials used. For example, a processor's speed is limited by the amount of power that can be dissipated in the transistors and other devices that make up the processor integrated circuit, which can literally melt if operated too fast. Reduction in size is also limited, because as more transistors dissipating a certain amount of power are packed into a smaller area, the amount of heat dissipated in a certain area increases. Even simple devices such as diodes used in high-frequency, high-power applications suffer from power limitations, since the physical size of an individual transistor or diode is typically very small.

Semiconductor devices enabling greater power dissipation and higher semiconductor device densities are desirable to provide higher performance, smaller electrical devices.

SUMMARY

The present invention provides in one example embodiment first and second synthetic diamond regions doped with boron. The second synthetic diamond region is doped with boron to a greater degree than the first synthetic diamond region, and in physical contact with the first synthetic diamond region. In a further example embodiment, the first and second synthetic diamond regions form a diamond semiconductor, such as a Schottky diode.

DETAILED DESCRIPTION

In the following detailed description of example embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the substance or scope of the present invention. The following detailed description is, therefore, not to be taken in a limiting sense, and the scope of the invention is defined only by the appended claims.

One example of the invention provides first and second synthetic diamond regions doped with boron. The second synthetic diamond region is doped with boron to a greater degree than the first synthetic diamond region, and in physical contact with the first synthetic diamond region. In a further example embodiment, the first and second synthetic diamond regions form a diamond semiconductor, such as a Schottky diode.

Figure 1:
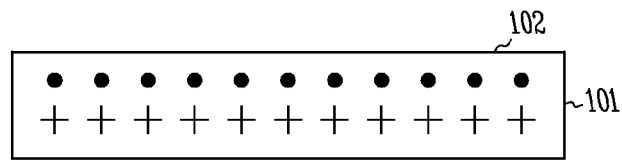
FIG. 1 shows a boron-doped diamond seed crystal with a hydrogen ion implant layer, consistent with an example embodiment of the present invention.

FIGS. 1-4 illustrate a method of producing a monocrystalline synthetic diamond Schottky diode, which is one example of a diamond semiconductor device such as can be produced using the present invention. FIG. 1 illustrates a diamond seed crystal that is heavily doped with boron, which has only three valence electrons relative to carbon's four valence electrons, making the diamond a strongly p-type semiconductor material. The absence of electrons in sites in the diamond that contain boron leaves a "hole" that is receptive to electrons, making what is in effect a mobile positive charge. The negatively charged boron atom is fixed in the diamond lattice, meaning that the boron atoms cannot move but contribute holes as electron receptors to the electrical conduction process.

In some examples, the boron is grown into the diamond as the diamond is formed by chemical vapor deposition, or is incorporated by another process, while other examples use diffusion or ion implantation to implant boron into diamond, whether the diamond is synthetic or naturally occurring. The diamond contains boron doping through at least a top region of the seed diamond 101 extending a half micron to a few microns, such that a top layer has a relatively uniform distribution of boron atoms distributed to a desired density.

The seed 101 is polished to have a flat top surface, and the edges of the seed are trimmed such as with a laser or cutting tool, and are cleaned, etched, and polished. Hydrogen atoms are then implanted to a desired depth, as is shown in FIG. 1 at 102. The hydrogen atoms are implanted under various conditions in various examples, but in one example are implanted at an angle of ten degrees relative to the diamond surface, and at a dose rate of approximately one microamp per square centimeter. The electrons are implanted with an energy of approximately 200 KeV, until the total dose of approximately ten to the seventeenth atoms per square centimeter are implanted into the diamond 101. Varying the parameters of the hydrogen implant will vary the depth and density of the resulting hydrogen implant layer. The hydrogen implant layer is shown as the dotted layer 102 of FIG. 1.

Once the hydrogen implantation into the boron-doped diamond seed is completed, more diamond is grown on the seed, such as via a chemical vapor deposition plasma reactor. Various technologies that can be employed for diamond formation in other examples, including microwave plasma reactors, DC plasma reactors, RF plasma reactors, hot filament reactors, and other such technologies. The formation of synthetic diamond can be achieved through a variety of methods and apparatus, such as that described in U.S. Pat. No. 6,582,513, titled "System and Method for Producing Synthetic Diamond", which is incorporated by reference.

The diamond grown in one example is a monocrystalline synthetic diamond uses a stream of gas, such as methane or other gas, to provide the precursor material for the plasma reactor to produce a plasma that precipitates to form diamond. The gas in some examples or in some layers of the diamond contains various impurities, such as boron dopants or various isotopes of carbon. For example, diamonds having a greater than average purity of carbon-12 and a corresponding reduced concentration of carbon-13 isotopes are known as isotopically enhanced, and are particularly thermally conductive. This makes them well-suited for applications such as semiconductor device fabrication, enabling higher power and higher density than can otherwise be achieved. Isotopic enhancement of the diamond CVD precursor gases with carbon-12 can result in a diamond having significantly less than the typical 1.1% carbon-13 concentration, resulting in thermal conductivity as high as 3300 W/mK. Other examples of methods of producing synthetic diamond with high thermal conductivity include growing diamond in a low nitrogen environment, growing synthetic diamond in an environment rich in hydrogen, and using boron doping resulting in an increase in thermal conductivity.

In some embodiments, diamond regions having boron or other dopants implanted will have somewhat larger or smaller lattice structures than undoped diamond as a result of placement of the dopant within the diamond crystal structure. The lattice mismatch between diamonds having different doping concentrations or between doped and undoped diamonds is controlled in some embodiments by implantation of ions selected to give the desired lattice structure. For example, a lightly boron-doped diamond region will have a lattice structure somewhat expanded relative to undoped diamond made from primarily carbon-12. Adding carbon-13 to the boron-doped diamond shrinks the lattice structure, and is used in some embodiments to eliminate the lattice mismatch between diamond layers or to control the lattice mismatch or strain between diamond layers.

In a more detailed embodiment, a first lightly boron-doped region is grown in contact with a second more heavily boron-doped region, in a diamond structure comprising approximately 99% carbon-12 and 1% carbon-13. Addition of more carbon 13 to the second more heavily boron-doped region enables matching the lattice structures of the more heavily boron-doped and less heavily boron-doped diamond regions to one another, reducing or eliminating lattice strain at the boundary between diamond layers.

Figure 2:
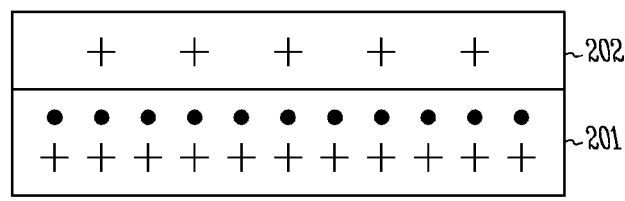
FIG. 2 shows a boron-doped diamond seed crystal with grown boron-doped diamond, consistent with an example embodiment of the present invention.

FIG. 2 shows the see diamond of FIG. 1 with a hydrogen implant layer 201 that has another synthetic diamond layer 202 that is boron-doped grown on the surface that was implanted with hydrogen. In some examples, the seed 201 is polished flat before hydrogen implantation or at some other point before growth of the second synthetic diamond region 202, and is trimmed to a desired size or shape such as by laser cutting before or after growth of the second synthetic diamond region. The top layer is grown to a desired thickness, such as 100 microns in one example, and is then polished and cut to form the diamond assembly shown in FIG. 2.

The assembly of FIG. 2 is then heated to a temperature sufficient to cause separation of the first diamond region 101 at the hydrogen implant level, resulting in a portion of the seed diamond region 101's becoming detached with the grown synthetic diamond region 202. This operation results in a seed diamond 301 that is somewhat smaller than the original seed diamond 101, due to the more heavily boron-doped diamond portion 302 that is removed with the more lightly boron-doped portion 303. The resulting structure of 302 and 303 forms the semiconductor portion of a Schottky diode, which is able to operate at particularly high voltage and power levels due to the characteristics of diamond when compared to other semiconductor materials such as silicon. In other examples, the grown region will be more heavily doped with boron than the seed region, the thicknesses of the diamond regions will differ, and other structural and design changes will be made.

Figure 3:
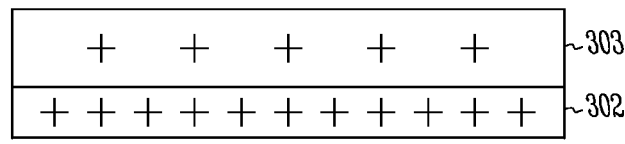
FIG. 3 shows a boron-doped diamond seed crystal with grown diamond separated at a hydrogen implant level, consistent with an example embodiment of the present invention.
Figure 3:
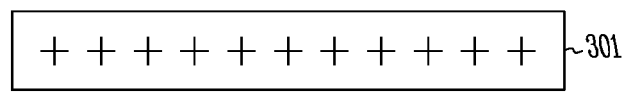
Figure 4:
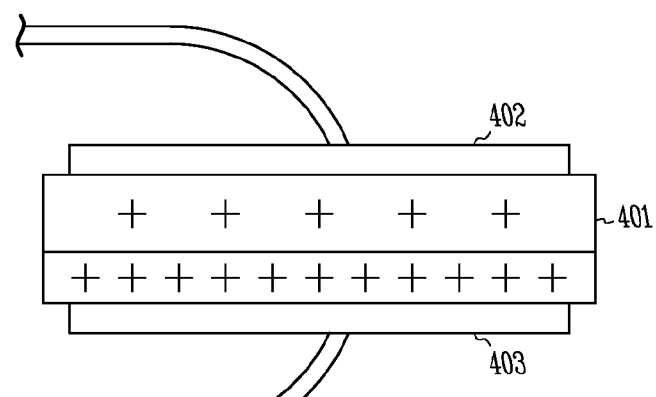
FIG. 4 shows a Schottky diode formed from the boron-doped diamond seed crystal with grown boron-doped diamond, consistent with an example embodiment of the present invention.

FIG. 4 shows the diamond assembly formed by 302 and 303 in FIG. 3 that was lifted off the diamond seed region at 401, with electrical leads attached at 402 and 403. The metal attached is selected based on the metal's work function or fermi function and the desired characteristics of the Schottky diode, and will typically be a metal or metal alloy containing metals such as aluminum, platinum, gold, titanium, or nickel. This forms a completed Schottky diode, which is similar to other types of diode in its ability to rectify some signals, or to pass current in only one direction under certain circumstances. Looking at the Schottky diode of FIG. 4, the terminal 403 is known as the anode, and terminal 402 is known as the cathode. When the anode is at a potential that is higher than that of the cathode by a certain voltage level, current will flow through the diode, but when the anode is lower in potential or voltage than the cathode current doesn't flow through the diode. This property makes a diode useful for a wide variety of electronic applications, including detection, filtering, and shaping electrical signals.

The rectifying portion of the Schottky diode is actually the metal-to diamond semiconductor contact, rather than the interface between semiconductor materials as is the case in most other types of diodes such as p-n semiconductor diodes. The theory of Schottky diode operation is well-understood but relatively complex, and results in a number of significant advantages over regular semiconductor diodes for many applications. The forward voltage drop across a Schottky diode is typically much less than across a typical p-n junction semiconductor diode, with typical values of 0.2 Volts drop across a Schottky diode and 0.6-0.7 Volts drop across a silicon p-n junction diode. The capacitance across a Schottky diode is also significantly lower, and the carrier recombination at the metal interface forming the Schottky diode barrier region is significantly faster than in p-n semiconductor junctions, on the order of ten picoseconds. This makes Schottky diodes particularly well-suited for applications such as high-frequency detection, mixing, and other such applications. The low noise characteristics of Schottky diodes relative to semiconductor p-n junction diodes further makes them desirable for use in low-level detection applications, such as radar or other radio detection.

Figure 5:
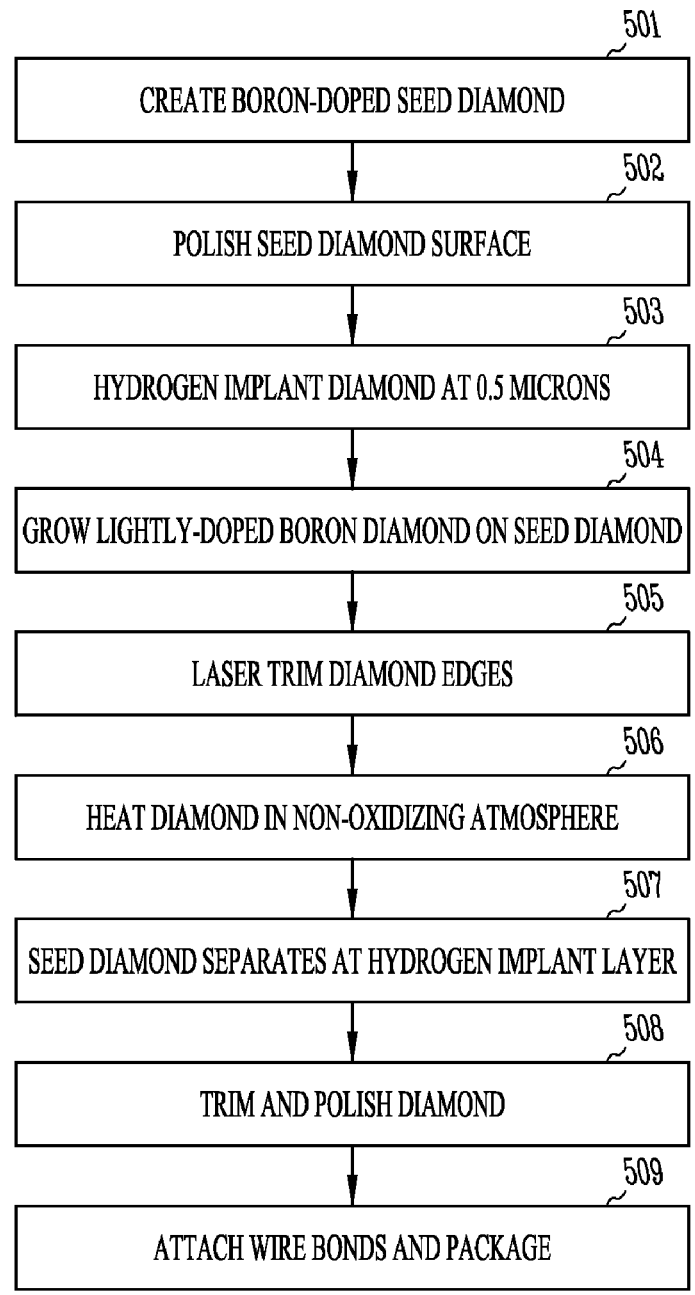
FIG. 5 shows a method of forming a boron-doped diamond semiconductor, consistent with an example embodiment of the present invention.

FIG. 5 is a flowchart of a method of making a boron-doped diamond semiconductor device such as that of FIG. 4. At 501, a boron-doped seed diamond is created. This can be achieved by ion implantation into a natural or synthetic diamond, by growing a synthetic diamond in an environment that is rich in boron, or by any other suitable method. Grown diamond can be produced by high pressure high temperature (HPHT) methods, by chemical vapor deposition, or by any other suitable method. The boron-doped seed diamond surface is polished at 502, to prepare a flat diamond crystal surface of a desired crystal orientation. For example, the diamond may be polished in the 100 plane, tilted two degrees toward the 110 plane, to produce a polished surface slightly off the 100 plane of the diamond. The edges of the seed may be cut and various other facets are polished or shaped in various examples, and the surfaces are cleaned with an acid wash, water rinse, and solvent dry.

Next, an implantation angle, energy, and dose are selected, and hydrogen ion implantation is performed at 503. The implantation parameters are configured to implant a selected density of hydrogen atoms at a selected depth in the seed diamond, as shown and described in FIG. 1. After hydrogen implantation, the implanted seed diamond is used as a seed for growing additional diamond, such as by chemical vapor deposition. The grown diamond in some examples includes either a higher or lower boron concentration than the seed diamond, as shown and described in FIG. 2. The diamond is grown until a desired thickness is reached, such as 500 microns thickness, or between 10 and 15,000 microns thick.

Once the growth process is complete, the diamond assembly is removed from the grower, and edges are trimmed with a laser cutter at 505. In other examples, the edges are trimmed using other methods, and may be polished or ground. The edges of the seed are thereby also trimmed to desired dimensions, such as back to the original seed dimensions before growth on top of the seed diamond region.

The resulting diamond assembly is heated in a non-oxidizing environment, such as in hydrogen or an inert gas, to an elevated temperature designed to cause the seed diamond region of the diamond assembly to separate at the area of hydrogen implantation. This separation occurs in one example at about 1200 degrees Celsius, while in other examples occurs within a range of 1100 to 2400 degrees Celsius. Once the seed and the grown diamond-seed diamond assembly separate, the grown diamond-see diamond assembly remains, as is shown in FIG. 3, with a portion of the seed diamond above the hydrogen implant layer attached to the grown diamond. The separation occurs spontaneously at elevated temperatures in some examples, but is cause by application of pressure across the hydrogen implant layer in other examples.

The result is a boron-doped semiconductor device that can be trimmed and polished further at 507, and that can be attached to wire leads and packaged for use as a semiconductor device as is shown at 509.

Figure 6:
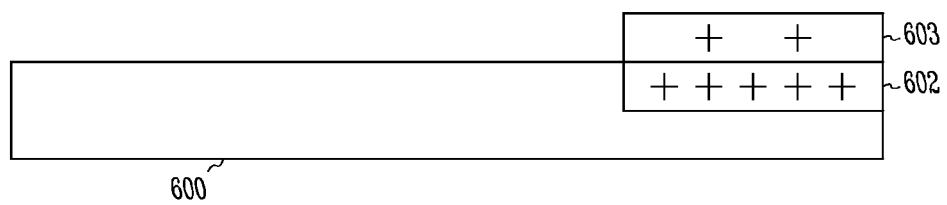
FIG. 6 shows an integrated circuit having first and second boron-doped diamond semiconductor regions, consistent with an example embodiment of the present invention.

Other embodiments of semiconductor devices consistent with various embodiments of the present invention include forming an integrated circuit, as is shown in FIG. 6. This figure shows generally a diamond semiconductor substrate at 601, which has at least a region or portion 602 that is boron-doped. A second region 603 is grown, implanted, or otherwise formed in contact with the diamond region 602, but with a different boron doping density. This forms the semiconductor portion of a Schottky diode, but similar processes can be used to form transistors and various other components. The elements 602 and 603 are coupled to a circuit using metallic wire having an appropriate work function, and in further examples are connected using polysilicon or other conductor or semiconductor elements to other portions of the integrated circuit.

Figure 7:
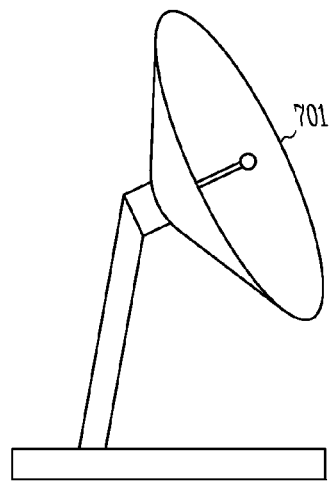
FIG. 7 shows an electronic device utilizing a boron-doped diamond semiconductor, consistent with an example embodiment of the present invention.

FIG. 7 illustrates an example of an electronic device that may be constructed, consistent with some example embodiments of the present invention. A radar apparatus 701 uses Schottky diodes for low-level, high-frequency radio detection, and for mixing in further example applications such as Doppler radar. The electronic device benefits from the increased performance possible with boron-doped diamond semiconductors, such as improved power handling, higher density, and higher performance relative to traditional semiconductors such as silicon.

Boron-doped diamond is also distinct from silicon-based semiconductors in that it is largely transparent, with a bluish tint. This makes boron-doped diamonds particularly well-suited for applications such as blue LED or laser semiconductor devices in configurations where light is emitted from other than an external surface of a semiconductor junction, in addition to other applications such as traditional LED or laser diodes. Because boron-doped diamond conducts electricity to some extent, it is also used in a variety of applications where conductivity is desired, such as in electrodes, in an electrically conductive cutting tool where the condition or other characteristics of the cutting tool can be electrically monitored, in conductive heat sinks or heat spreaders, and in optical windows that can be heated or that have an index of refraction that can be altered by current flow.

Schottky barrier junctions are further usable in a variety of applications other than Schottky diodes, including in use in bipolar junction transistors where a Schottky junction is located between the base and collector of the transistor. This prevents the transistor from saturating too deeply, resulting in faster switching times for the transistor. Metal-semiconductor field effect transistors (MESFETs) also use a reverse-biased Schottky barrier to provide the depletion region in the transistor, ans works similarly to a JFET. Still other devices, including high electron mobility transistors (HEMTs) use Schottky barriers in a heterojunction device to provide extremely high conductance in a transistor.

It is anticipated that the methods and devices described here will apply not only the Schottky diodes and related devices, but to other semiconductors, integrated circuits, and electronic devices. Although specific embodiments have been illustrated and described herein, those of ordinary skill in the art will appreciate that a variety of arrangements which are calculated to achieve the same purpose may be substituted for the specific embodiments shown. This application is intended to cover any adaptations or variations of the invention. It is intended that this invention be limited only by the claims, and the full scope of equivalents thereof.

What is claimed is:

1. A method of fabricating a boron-doped diamond Schottky diode device, comprising:
   growing a first synthetic diamond region doped with boron;

implanting hydrogen at a desired depth into the first synthetic diamond region;

growing a second synthetic diamond region doped with boron in a density different that the boron doping density of the first synthetic diamond region, the second synthetic diamond region grown on the first synthetic diamond region after implantation of hydrogen; and heating at least the first synthetic diamond region to separate the first synthetic diamond region at the depth of hydrogen implant; and forming a first metal contact attached to the first synthetic diamond region and a second metal contact attached to the second synthetic diamond region, wherein the less heavily boron-doped synthetic diamond region comprises a cathode of a Schottky diode.

2. The method of claim 1, wherein at least one of the first and second synthetic diamond regions are fabricated as a monocrystalline synthetic diamond via chemical vapor deposition.

3. The method of claim 1, wherein at least one of the first and second synthetic diamond regions comprises less than 1 ppm impurities, impurities not including boron.

4. The method of claim 1, wherein at least one of the first and second synthetic diamond regions comprises less than 1 ppm nitrogen.

5. The method of claim 1, wherein at least one of the first and second synthetic diamond regions has a thermal conductivity greater than 2500 W/mK.

6. The method of claim 1, wherein at least one of the first and second synthetic diamond regions has a thermal conductivity greater than 3200 W/mK.

7. The method of claim 1, wherein at least one of the first and the second synthetic diamond regions is isotopically enhanced with carbon-12 such that the resulting carbon-13 concentration is less than 1%.

8. The method of claim 1, wherein at least one of the first and second synthetic diamond regions is isotopically enhanced with carbon-12 such that the resulting carbon-13 concentration is less than 0.1%.

9. The method of claim 1, wherein at least one of the first and second synthetic diamond regions is isotopically enhanced with carbon-12 such that the resulting carbon-13 concentration is less than 0.01%.

10. The method of claim 1, wherein at least one of the first and second synthetic diamond regions has a nitrogen concentration of less than 50 ppm.

11. The method of claim 1, wherein at least one of the first and second synthetic diamond regions has a nitrogen concentration of less than 10 ppm.

12. The method of claim 1, wherein at least one of the first and second synthetic diamond regions has a nitrogen concentration of less than 5 ppm.

* * * * *